United States Patent
Liao

(10) Patent No.: US 8,503,967 B2
(45) Date of Patent: Aug. 6, 2013

(54) AMPLIFIER AND ASSOCIATED RECEIVER

(75) Inventor: Chih-Fan Liao, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 47 days.

(21) Appl. No.: 13/339,888

(22) Filed: Dec. 29, 2011

(65) Prior Publication Data

US 2013/0033324 A1    Feb. 7, 2013

Related U.S. Application Data

(60) Provisional application No. 61/514,982, filed on Aug. 4, 2011.

(51) Int. Cl.
 *H04B 1/16*    (2006.01)
(52) U.S. Cl.
 USPC ........ 455/341; 455/334; 455/130; 455/232.1; 455/230; 330/124 R; 330/69; 330/260
(58) Field of Classification Search
 USPC .. 455/341, 334, 130, 232.1, 230; 330/124 R, 330/69, 260
 See application file for complete search history.

(56) References Cited

U.S. PATENT DOCUMENTS

| | | | | |
|---|---|---|---|---|
| 6,057,731 | A * | 5/2000 | Gorcea et al. ................... | 330/69 |
| 7,436,260 | B2 * | 10/2008 | Chamla et al. ............ | 330/124 R |
| 7,619,468 | B1 * | 11/2009 | Bowles et al. ............ | 330/124 R |

OTHER PUBLICATIONS

Beffa, F., et al.; "A Receiver for WCDMA/EDGE Mobile Phones with Inductorless Front-End in 65nm CMOS;" IEEE International Solid-State Circuits Conference; 2011; pp. 370-372.
Lu, I.S.C., et al.; "A SAW-less GSM/GPRS/EDGE Receiver Embedded in a 65nm SoC;" EEE International Solid-State Circuits Conference; 2011; pp. 364-366.
Cicalini, A., et al.; A 65nm CMOS SoC with Embedded HSDPA/EDGE Transceiver, Digital Baseband and Multimedia Processor EEE International Solid-State Circuits Conference; 2011; pp. 368-370.
He, X., et al.; "A Compact SAW-less Mulitband WCDMA/GPS Receiver Front-End with Translational Loop for Input Matching;" EEE International Solid-State Circuits Conference; 2011; pp. 372-374.
U.S. Appl. No. 13/109,000, filed May 17, 2011.

* cited by examiner

*Primary Examiner* — Sanh Phu
(74) *Attorney, Agent, or Firm* — McClure, Qualey & Rodack, LLP

(57) ABSTRACT

An amplifier is arranged to receive an input signal and provide an output signal in response, and includes a main amplifier core and an auxiliary circuit. The main amplifier core includes an input node, an output node and a sum node with the input node coupled to the input signal, and is arranged to provide an interior signal to the sum node and output the output signal at the output node in response to signals provided to the sum node. The auxiliary circuit is coupled between the input node and the sum node, and is arranged to match an impedance of the input node and provide a cancelling signal to the sum node in response to the input signal. An associated receiver is also disclosed.

17 Claims, 5 Drawing Sheets

AMPLIFIER AND ASSOCIATED RECEIVER

This application claims the benefit of U.S. provisional patent application No. 61/514,982, filed Aug. 4, 2011, the subject matter of which is incorporated herein by reference.

FIELD OF THE INVENTION

The present invention relates to amplifier and associated receiver, and more particularly, to amplifier and associated receiver arranged to implement RF (Radio Frequency) wireless receiving frontend with enhanced noise suppression.

BACKGROUND OF THE INVENTION

Wireless networks and systems, such as wireless communication, broadcasting and satellite positioning systems, have been broadly utilized in modern society. Wireless systems are implemented with receivers which receive and process wireless signals. The receiver includes circuitry RF frontend as a portion of physical layer of networking. The RF frontend receives wireless signal as electric (e.g., current and/or voltage) analog RF signal, amplifies the RF signal and down-converts the amplified RF signal to IF (Intermediate Frequency) signals and/or baseband signals for further signal process, e.g., low-pass filtering, analog-to-digital converting, decoding, de-scrambling, demodulation, and/or inverse constellation mapping, etc. Thus, information, messages, data and commands carried in the wireless signal can be retrieved.

SUMMARY OF THE INVENTION

An embodiment of the invention is providing an amplifier arranged to receive an input signal and provide an output signal in response; the amplifier includes a main amplifier core, an auxiliary amplifier core, a feedback circuit and a weighting circuit. The main amplifier core includes an input node, an output node and a sum node; the input node is coupled to the input signal and is arranged to interface an interface resistance, and the main amplifier core is arranged to provide an interior signal to the sum node and output the output signal at the output node in response to signals provided to the sum node. The auxiliary amplifier core includes a first auxiliary node and a second auxiliary node; the first auxiliary node is coupled to the input node, and the auxiliary amplifier core is arranged to provide an auxiliary signal to the second auxiliary node in response to a signal at the first auxiliary node. The feedback circuit is coupled between the first auxiliary node and the second auxiliary node, and is arranged to provide a feedback resistance between the first auxiliary node and the second auxiliary node. The weighting circuit is coupled between the second auxiliary node and the sum node, and is arranged to weight the auxiliary signal by a weighting gain and provide a cancelling signal to the sum node in response to the weighted auxiliary signal, wherein the weighting gain is in association with a ratio between the feedback resistance and the interface resistance.

The amplifier enhances noise suppression. When the auxiliary amplifier core produces noise and causes a first voltage fluctuation at the second auxiliary node, a second voltage fluctuation is induced at the first auxiliary node. The main amplifier core provides a first current fluctuation to the sum node in response to the second voltage fluctuation by transferring the second voltage fluctuation to the first current fluctuation with a trans-conductance gain, and the weighting circuit provides a second current fluctuation to the sum node in response to the first voltage fluctuation by transferring the first voltage fluctuation to the second current fluctuation with the weighting gain, wherein a ratio between the trans-conductance gain and the weighting gain is in association with the ratio between the feedback resistance and the interface resistance, and the first current fluctuation and the second current fluctuation are out-of-phase (i.e., the first current fluctuation flows into the sum node and the second current fluctuation flows out of the sum node, or vice versa). Therefore, at the output node, current fluctuation of the output signal is suppressed.

The amplifier also enhances signal gain, e.g., an overall trans-conductance from voltage of the input signal to current of the output signal. The main amplifier core is arranged to draw a first signal current from the sum node in response to a first signal voltage at the input node, the auxiliary amplifier core and the feedback circuit are arranged to provide a second signal voltage in response to the first signal voltage, and the weighting circuit is arranged to draw a second signal current from the sum node in response to the second signal voltage. The first signal voltage and the second signal voltage are out-of-phase (e.g., by 180 degrees), the first signal current and the second signal current are in-phase, so current of the output signal drawn from the output node is enhanced.

In an embodiment, the auxiliary amplifier core includes a first transistor and a second transistor. The first transistor includes a first gate, a first drain and a first source respectively coupled to the first auxiliary node, the second auxiliary node and a first supply voltage. The second transistor includes a second gate, a second drain and a second source respectively coupled to the first auxiliary node, the second auxiliary node and a second supply voltage.

In an embodiment, the main amplifier core includes an input stage and an output stage. The input stage is coupled between the input node and the sum node, and includes a third transistor which has a third gate, a third drain and a third source respectively coupled to the input node, the sum node and a third supply voltage. The output stage is coupled between the sum node and the output node, and is arranged to draw a current from the output node in response to currents drawn from the sum node respectively by the input stage and the weighting circuit. The output stage includes a fourth transistor with a fourth gate, a fourth drain and a fourth source respectively coupled to a first bias, the output node and the sum node. And the weighting circuit includes a fifth transistor comprising a fifth gate, a fifth source and a fifth gate respectively coupled to the second auxiliary node, the sum node and a fourth supply voltage.

Another embodiment of the invention is providing a receiver including an amplifier, a mixer and a secondary amplifier. The amplifier is arranged to receive an input signal and provide an output signal in response. The mixer is coupled to the amplifier through a first current mode interface, and is arranged to mix the output signal with a carrier signal to provide a mixed signal. The secondary amplifier is coupled to the mixer through a second current mode interface, and is arranged to provide an internal signal in response to the mixed signal.

In an embodiment, the amplifier includes a main amplifier core and an auxiliary circuit. The main amplifier core includes an input node, an output node and a sum node; the input node is coupled to the input signal, and the main amplifier core is arranged to provide an interior signal to the sum node and output the output signal at the output node in response to signals provided to the sum node. The auxiliary circuit is coupled between the input node and the sum node, and is arranged to match an impedance of the input node and provide a cancelling signal to the sum node in response to the input signal. In an embodiment, the auxiliary circuit includes an auxiliary amplifier core, a feedback circuit and a weighting circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
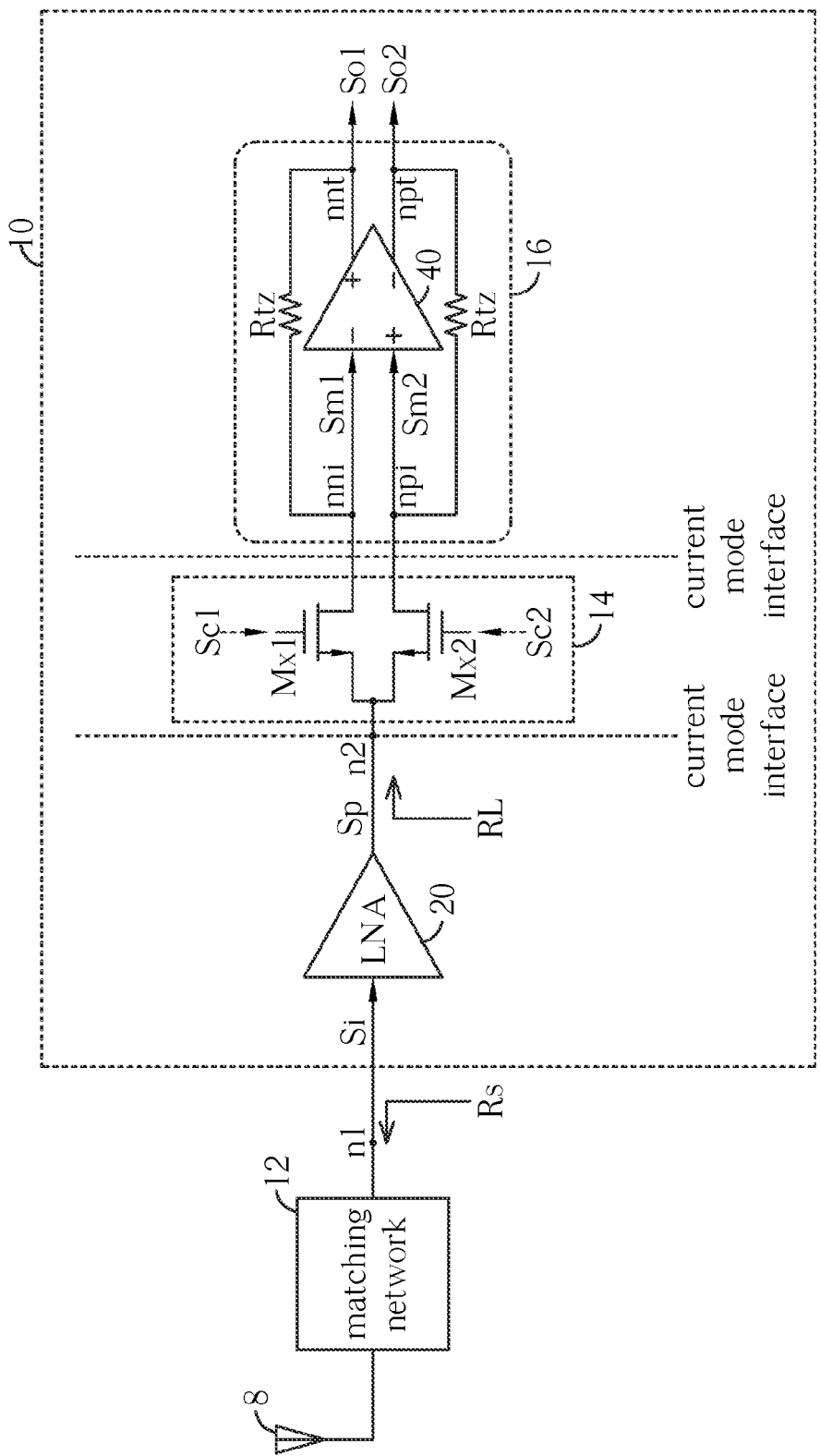
FIG. 1 illustrates a receiver according to an embodiment of the invention.

Please refer to FIG. 1 illustrating a receiver 10 in cooperation with other peripherals according to an embodiment of the invention. The receiver 10 implements an RF frontend with an amplifier 20, a mixer block 14 and a secondary amplifier 16. In cooperation with the amplifier 10, an antenna 8 is arranged to receive wireless RF signal as electric signal, and a matching network 12 is arranged to relay the received electric signal as an input signal Si, and the input signal Si is fed to the receiver 10 through a node n1. The matching network may include transmission lines, inductor(s), capacitor(s) and/or resistor(s), and an impedance from the receiver 10 toward the node n1 can be modeled by a resistor Rs which provides an interface resistance.

In the receiver 10, the amplifier 20 is arranged to function as a Low-Noise Amplifier (LNA) for receiving the input signal Si at the node n1 and providing an output signal Sp at a node n2 in response. In an embodiment, the mixer circuit 14 is coupled to the amplifier 20 through a current mode interface of the node n2, and is coupled to the secondary amplifier 16 through another current mode interface of nodes nni and npi.

In an embodiment, the mixer circuit 14 includes two transistors Mx1 and Mx2 as two mixers; the transistors Mx1 can be an n-channel Metal-Oxide-Semiconductor field effect transistor (MOSFET) with a drain, a gate and a source respectively coupled to the node nni, a carrier signal Sc1 and the node n2, and is arranged to mix the output signal Sp with the carrier signal Sc1 to provide a mixed signal Sm1. The transistors Mx1 and Mx2 can be matched; similar to the transistor Mx1, the transistor Mx2, with a drain, a gate and a source respectively coupled to the node np1, a carrier signal Sc2 and the node n2, is arranged to mix the output signal Sp with the carrier signal Sc2 to provide a mixed signal Sm2. The signals Sc1 and Sc2 can be of a same frequency and a phase difference of 180 degrees, so the mixed signals Sm1 and Sm2 form a pair of differential mixed signals. In this way, the mixer circuit 14 down-converts the output signal Sp of RF to the mixed signals Sm1 and Sm2 of IF or baseband, and the mixed signals Sm1 and Sm2 are transmitted to the secondary amplifier 16.

The secondary amplifier 16 functions as an IF or baseband amplifier, and is arranged to provide a pair of internal signals So1 and So2 in response to the mixed signals Sm1 and Sm2. The secondary amplifier 16 includes a secondary amplifier core 40 and two resistors Rtz for feedback. The secondary amplifier core 40 and the transistors Rtz amplify the mixed signals Sm1 and Sm2 received from a pair of differential input terminals at the nodes nni and nnp, and output the resultant internal signals So1 and So2 through a pair of differential output terminals at nodes nnt and npt. One of the resistors Rtz is coupled between the nodes nni and nnt, the other is coupled between the nodes npi and npt.

Figure 2:
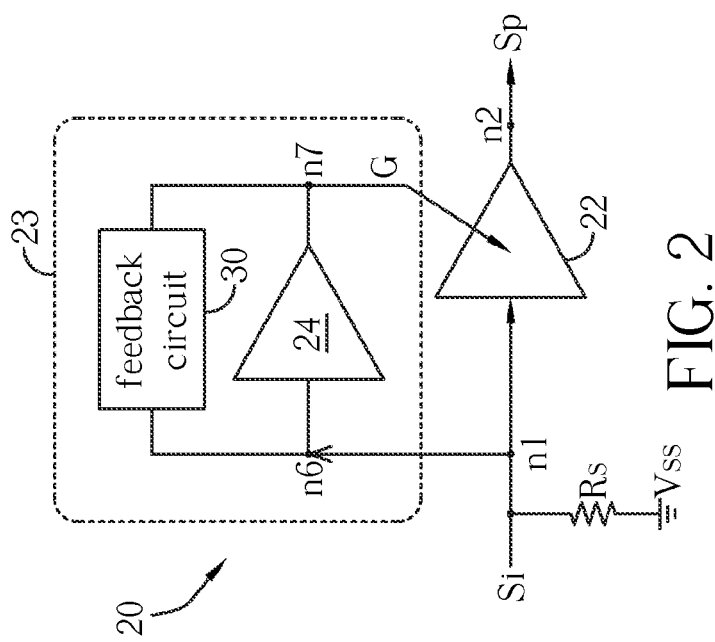
FIG. 2 illustrates an amplifier, applicable to the receiver of FIG. 1, according to an embodiment of the invention.

Please refer to FIG. 2 illustrating a block diagram of the amplifier 20 according to an embodiment of the invention. The amplifier 20 includes a main amplifier core 22 and an auxiliary circuit 23. The main amplifier core 22 is coupled between the nodes n1 (as an input node) and n2 (an output node), and is arranged to amplify the input signal Si with high linearity and support the current mode interface (FIG. 1) of the node n2. On the other hand, the auxiliary circuit 23, including an auxiliary amplifier core 24 and a feedback circuit 30, is arranged to match impedance of the input node n1 by matching the resistor Rs at the node n1. The feedback circuit 30 and the auxiliary amplifier core 24 are both coupled between nodes n6 and n7 (respectively as a first auxiliary node and a second auxiliary node).

For high linearity and supporting of the current mode interface, the main amplifier core 20 is arranged to drive current of the output signal Sp with a lowered voltage gain from voltage of the input signal Si to voltage of the output signal Sp. For input impedance match, the auxiliary amplifier core 24 is arranged to provide a relatively higher voltage gain from voltage at the node n6 to voltage at the node n7, such that resistance provided by the feedback circuit 30 can dominate input impedance at the node n1. That is, in response to voltage of the signal Si at the node n1, voltage swing at the node n7 is larger than voltage swing at the node n2 since the auxiliary circuit 23 provides a greater voltage gain than the main amplifier core 22, and therefore input impedance match at the node n1 can be controlled by resistance provided by the feedback circuit 30.

As the auxiliary circuit 23 and the main amplifier core 22 respectively fulfill potentially conflicted demands of input impedance match and current mode interface of high linearity, noise issue in such combined architecture is of concern. To suppress noise, signal at the node n7 is arranged to be weighted by a weighting gain G and be fed back to the main amplifier core 22.

Figure 3:
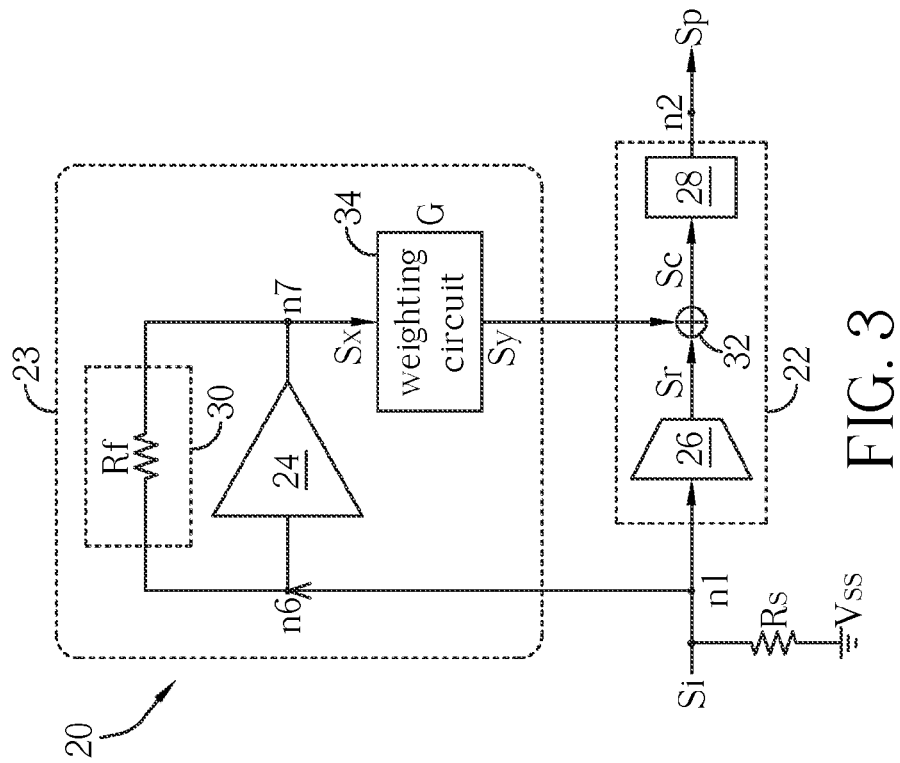
FIG. 3 illustrates an amplifier, arranged to implement the amplifier of FIG. 2, according to an embodiment of the invention.

Please refer to FIG. 3 illustrates a block diagram implementing the amplifier 20 of FIG. 2 according to an embodiment of the invention. In addition to the main amplifier core 22, the auxiliary amplifier core 24 and the feedback circuit 30, a weighting circuit 34 is included in the amplifier 20 of FIG. 3 for weighting a signal Sx at the node n7.

As shown in FIG. 3, besides the nodes n1 and n2 respectively as the input node and the output node, the main amplifier core 22 also includes an input stage 26, a sum node 32 and an output stage 28. The node n1 interfaces an interface resistance of the resistor Rs, and the main amplifier core 22 is arranged to provide an interior signal Sr to the sum node 32 and output the output signal Sp at the node n2 in response to signals provided to the sum node 32. The auxiliary amplifier core 24, along with the feedback circuit 30, is arranged to provide an auxiliary signal Sx to the node n7 in response to signal at the node n6. The feedback circuit 30 is arranged to provide a feedback resistance by a resistor Rf coupled between the nodes n6 and n7. The weighting circuit 34 is coupled between the node n7 and the sum node 32, and is arranged to weight the auxiliary signal Sx by a weighting gain G and provide a cancelling signal Sy to the sum node 32 in response to the weighted auxiliary signal Sx. In an embodiment, the weighting gain G is in association with a ratio between the feedback resistance of the resistor Rf and the interface resistance of the resistor Rs.

In the main amplifier core 22, the input stage 26 is coupled between the node n1 and the sum node 32, and is arranged to draw current of the interior signal Sr from the sum node 32 in response to voltage of the input signal Si. On the other hand, the weighting circuit 34 is arranged to draw current of the cancelling signal Sy in response to voltage of the auxiliary signal Sx.

The output stage 28 in the main amplifier core 22 is coupled between the sum node 32 and the output node n2, and is arranged to draw current of the output signal Sp from the node n2 in response to current of a sum signal Sc, wherein current of the sum signal Sc combines currents drawn from the sum node 32 by the input stage 26 and the weighting circuit 34.

Figure 4:
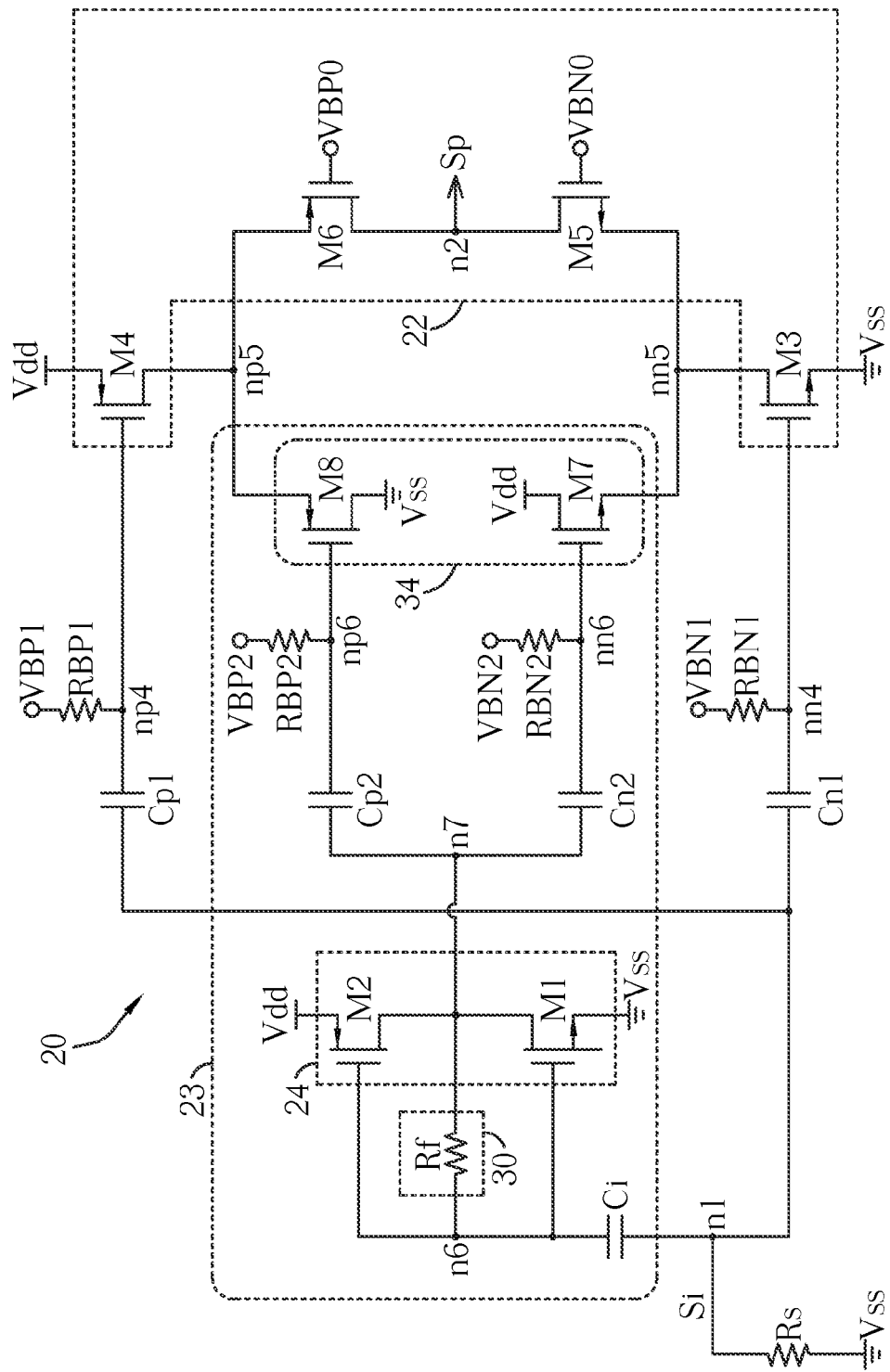
FIG. 4 illustrates a circuit architecture for implementing the amplifier of FIG. 3 according to an embodiment of the invention.

Please refer to FIG. 4 illustrating a circuit architecture arranged to implement the amplifier 20 shown in FIG. 3. As shown in FIG. 4, the amplifier 20 operates between two supply voltages Vdd and Vss. An amplifier of a push-pull topology can be arranged to implement the auxiliary amplifier core 24, which includes two complementary transistors M1 and M2. A gate, a drain and a source of the transistor M1 (e.g., an n-channel MOSFET) are respectively coupled to the nodes n6, n7 and the supply voltage Vss; and a gate, a drain and a source of the transistor M2 (e.g., a p-channel MOSFET) are respectively coupled to the nodes n6, n7 and the supply voltage Vdd. The node n6 is coupled to the node n1 through a capacitor Ci of AC (Alternating Current) coupling.

On the other hand, an amplifier of a cascode push-pull topology can be arranged to implement the main amplifier core 22, which includes a pair of complementary transistors M3 and M4, and another pair of complementary transistors M5 and M6. Also, a pair of complementary transistors M7 and M8 are arranged to implement the weighting circuit 34.

Arranged to function as the input stage 26 of FIG. 3, a gate, a drain and a source of the transistor M3 (e.g., an n-channel MOSFET) are respectively coupled to nodes nn4, nn5 and the supply voltage Vss. To function as the output stage 28 of FIG. 3, a gate, a drain and a source of the transistor M5 (e.g., an n-channel MOSFET) are respectively coupled to a bias voltage VBN0, nodes n2 and nn5. In the weighting circuit 34, a gate, a source and a drain of the transistor M7 (e.g., an n-channel MOSFET) are respectively coupled to nodes nn6, nn5 and the supply voltage Vdd. The node nn4 is coupled to the node n1 through a capacitor Cn1 of AC coupling. A bias voltage VBN1 is coupled to the node nn4 by a resistor RBN1 for DC (Direct Current) bias of the node nn4, and another bias voltage VBN2 is coupled to the node nn6 by a resistor RBN2 for DC bias of the node nn6. As sources of the transistors M5 and M7 are commonly coupled to the node nn5, the node nn5 functions as the sum node 32 of FIG. 3.

Complementarily, also arranged to function as the input stage 26 of FIG. 3, a gate, a drain and a source of the transistor M4 (e.g., a p-channel MOSFET) are respectively coupled to nodes np4, np5 and the supply voltage Vdd. Arranged to function as the output stage 28 of FIG. 3, a gate, a drain and a source of the transistor M6 (e.g., a p-channel MOSFET) are respectively coupled to a bias voltage VBP0, nodes n2 and np5. In the weighting circuit 34, a gate, a source and a drain of the transistor M8 (e.g., a p-channel MOSFET) are respectively coupled to nodes np6, np5 and the supply voltage Vss. The node np4 is coupled to the node n1 through a capacitor Cp1 of AC coupling. A bias voltage VBP1 is coupled to the node np4 by a resistor RBP1 for DC bias of the node np4, and a bias voltage VBP2 is coupled to the node np6 by a resistor RBP2 for DC bias of the node np6. As sources of the transistors M6 and M8 are commonly coupled to the node np5, the node np5 also functions as the sum node 32 of FIG. 3.

Figure 5:
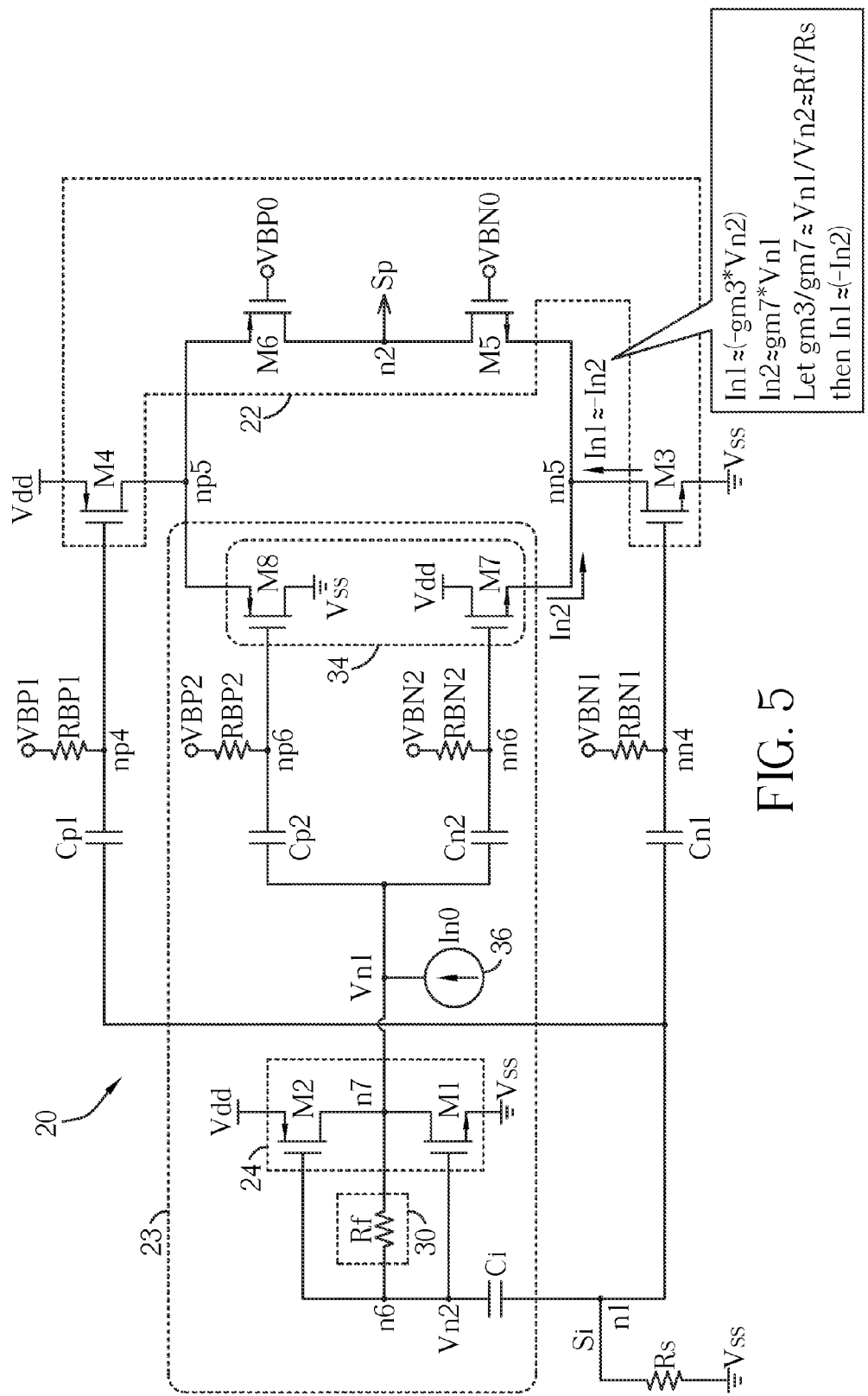
FIG. 5 illustrates noise suppression of the amplifier shown in FIG. 4.

Please refer to FIG. 5 illustrating noise suppression of the amplifier 20 shown in FIG. 4. As shown in FIG. 5, noise related to the auxiliary amplifier core 24 can be modeled by a noise current source 36, which injects a current fluctuation In0 to the node n7, and therefore contributes a voltage fluctuation Vn1 at the node n7. Consequently, a voltage fluctuation Vn2 at the node n6 is induced by the voltage fluctuation Vn1 at the node n7, and the main amplifier core 22 provides a current fluctuation In1 to the node nn5 in response to the voltage fluctuation Vn2 by transferring the voltage fluctuation Vn2 to the current fluctuation In1 with a trans-conductance gain. The trans-conductance gain can be approximated by a (small-signal) trans-conductance gm3 of the transistor M3, therefore the current fluctuation In1 injected to the node nn5 can be approximated by a product $(-gm3*Vn2)$.

On the other hand, the weighting circuit 34 provides a current fluctuation In2 to the node nn5 in response to the voltage fluctuation Vn1 by transferring the voltage fluctuation Vn1 to the current fluctuation In2 with the weighting gain G. The weighting gain G can be approximated by a (small-signal) trans-conductance gm7 of the transistor M7, so the current fluctuation In2 flowing into the node nn5 can be approximated by a product $gm7*Vn1$.

In an embodiment, a ratio between the trans-conductance gain and the weighting gain is in association with the ratio between feedback resistance of the resistor Rf and the interface resistance of the resistor Rs. That is, a ratio gm3/gm7 can be set to (Rs+Rf)/Rs, or Rf/Rs since resistance of the resistor Rs is much smaller than that of the resistor Rf. As a ratio Vn1/Vn2 can be approximated by (Rs+Rf)/Rs or Rf/Rs with voltage division of the resistors Rf and Rs, the current fluctuations In1 and In2 are out-of-phase by 180 degrees with $In1=(-gm3*Vn2)=-(gm7*Vn1)=-In2$ approximately, and the current fluctuations In1 and In2 neutralize with each other at the node nn5. In this way, noise suppression of the amplifier 20 is enhanced.

Because the trans-conductance ratio gm3/gm7 is set equal to the ratio Rf/Rs, current consumed through source-drain of the transistors M7 and M8 is much less than current conducted through source-drain of the transistors M5 and M6. Also, the circuit architecture shown in FIG. 4 benefits from enhanced signal gain, e.g., an overall trans-conductance from voltage of the input signal Si to current of the output signal Sp, as illustrated in FIG. 6.

Figure 6:
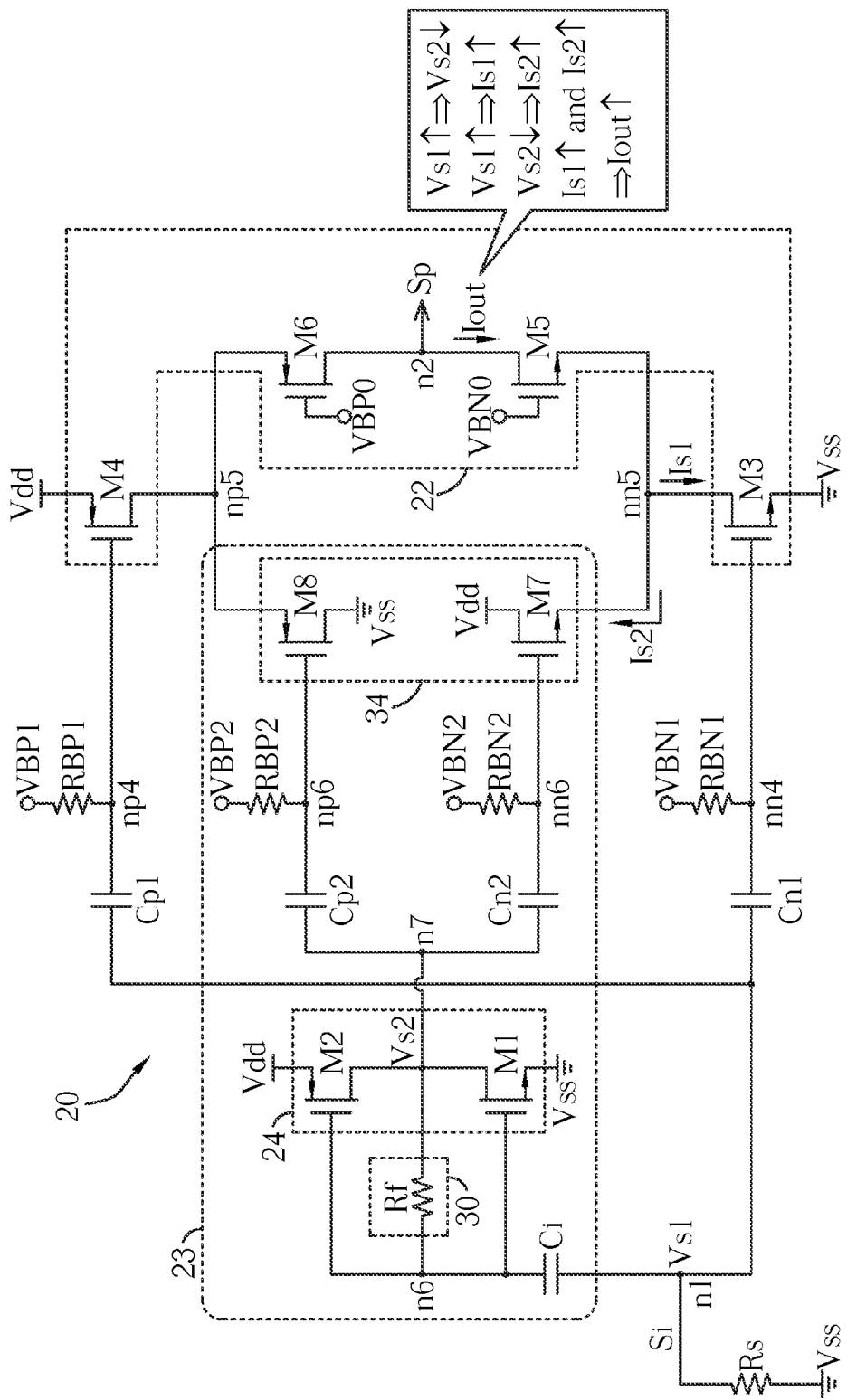
FIG. 6 illustrates signal enhancing of the amplifier shown in FIG. 4.

Referring to FIG. 6, the main amplifier core 22 drives to draw a signal current Is1 from the node nn5 in response to a signal voltage Vs1 at the node n1. On the other hand, the auxiliary amplifier core 24 and the feedback circuit 30 contributes a signal voltage Vs2 at the node n7 in response to the signal voltage Vs1, and the weighting circuit 34 draws a signal current Is2 from the sum node in response to the signal voltage Vs2. Because a voltage gain of the auxiliary amplifier core 24 from the signal voltage Vs1 to the signal voltage Vs2 is negative, the signal voltages Vs1 and Vs2 are out-of-phase. For example, when the signal voltage Vs1 increases, the signal voltage Vs2 decreases. Since a trans-conductance of the weighting circuit 34 from the signal voltage Vs2 to the signal current Is2 drawn from the node nn5 is negative, the signal current Is2 increases following the decreasing signal voltage Vs2. Also, as a trans-conductance of the transistor M3 from the signal voltage Vs1 to the signal current Is1 drawn from the node nn5 is positive, the signal current Is1 also increases in respond to the increasing signal voltage Vs1. Summing the increasing signal currents Is1 and Is2, a current Iout of the output signal Sp at the node n2 also increases, and signal gain of the amplifier 20 is therefore enhanced.

To sum up, instead of a single cascode topology with source degenerated inductance for input impedance match, a combined architecture is adopted in the embodiments of the invention with the main amplifier core for current mode output of high linearity, as well as the auxiliary amplifier core and the feedback circuit for input impedance match. In addition, the weighting circuit for sensing noise fluctuation of the auxiliary amplifier core is included, therefore overall affection of the noise fluctuation can be suppressing in the main amplifier core.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An amplifier receiving an input signal and providing an output signal in response, comprising:
   a main amplifier core comprising an input node, an output node and a sum node, the input node being coupled to the input signal and interfacing an interface resistance, and the main amplifier core arranged to provide an interior signal to the sum node and output the output signal at the output node in response to signals provided to the sum node;
   an auxiliary amplifier core comprising a first auxiliary node and a second auxiliary node, the first auxiliary node coupled to the input node, and the auxiliary amplifier core arranged to provide an auxiliary signal to the second auxiliary node in response to a signal at the first auxiliary node;
   a feedback circuit coupled between the first auxiliary node and the second auxiliary node, and arranged to provide a feedback resistance between the first auxiliary node and the second auxiliary node; and
   a weighting circuit coupled between the second auxiliary node and the sum node, and arranged to weight the auxiliary signal by a weighting gain and provide a cancelling signal to the sum node in response to the weighted auxiliary signal;
   wherein the weighting gain is in association with a ratio between the feedback resistance and the interface resistance.

2. The amplifier as claimed in claim 1, wherein when a first voltage fluctuation at the second auxiliary node induces a second voltage fluctuation at the first auxiliary node, the main amplifier core provides a first current fluctuation to the sum node in response to the second voltage fluctuation, the weighting circuit provides a second current fluctuation to the sum node in response to the first voltage fluctuation, wherein the first current fluctuation and the second current fluctuation are out-of-phase.

3. The amplifier as claimed in claim 2, wherein the main amplifier core transfers the second voltage fluctuation to the first current fluctuation with a trans-conductance gain, the weighting circuit transfers the first voltage fluctuation to the second current fluctuation with the weighting gain, and a ratio between the trans-conductance gain and the weighting gain is in association with the ratio between the feedback resistance and the interface resistance.

4. The amplifier as claimed in claim 1, wherein the main amplifier core is arranged to draw a first signal current from the sum node in response to a first signal voltage at the input node, the auxiliary amplifier core and the feedback circuit are arranged to provide a second signal voltage in response to the first signal voltage, and the weighting circuit is arranged to draw a second signal current from the sum node in response to the second signal voltage; wherein the first signal voltage and the second signal voltage are out-of-phase, the first signal current and the second signal current are in-phase.

5. The amplifier as claimed in claim 1, wherein the auxiliary amplifier core comprises:
   a first transistor comprising a first gate, a first drain and a first source respectively coupled to the first auxiliary node, the second auxiliary node and a first supply voltage, and
   a second transistor comprising a second gate, a second drain and a second source respectively coupled to the first auxiliary node, the second auxiliary node and a second supply voltage.

6. The amplifier as claimed in claim 1, wherein the main amplifier core comprises:
   an input stage coupled between the input node and the sum node, and comprising a first transistor which comprises a first gate, a first drain and a first source respectively coupled to the input node, the sum node and a first supply voltage; and the weighting circuit comprises:
   a second transistor comprising a second gate, a second source and a second gate respectively coupled to the second auxiliary node, the sum node and a second supply voltage.

7. The amplifier as claimed in claim 6, wherein the main amplifier core further comprises:
   an output stage coupled between the sum node and the output node, and arranged to draw a current from the output node in response to currents drawn from the sum node respectively by the input stage and the weighting circuit.

8. The amplifier as claimed in claim 7, wherein the output stage comprises:
   a third transistor comprising a third gate, a third drain and a third source respectively coupled to a first bias, the output node and the sum node.

9. A receiver comprising:
   an amplifier for receiving an input signal and providing an output signal in response, and comprising:
      a main amplifier core comprising an input node, an output node and a sum node, the input node being coupled to the input signal, and the main amplifier core is arranged to provide an interior signal to the sum node and output the output signal at the output node in response to signals provided to the sum node; and
      an auxiliary circuit coupled between the input node and the sum node, and arranged to match an impedance of the input node and provide a cancelling signal to the sum node in response to the input signal;

a mixer coupled to the amplifier through a first current mode interface, and arranged to mix the output signal with a carrier signal to provide a mixed signal; and a secondary amplifier coupled to the mixer through a second current mode interface, and arranged to provide an internal signal in response to the mixed signal.

10. The receiver as claimed in claim 9, wherein the input node interfaces an interface resistance, and the auxiliary circuit comprises:

an auxiliary amplifier core comprising a first auxiliary node and a second auxiliary node, the first auxiliary node coupled to the input node, and the auxiliary amplifier core arranged to provide an auxiliary signal to the second auxiliary node in response to a signal at the first auxiliary node;

a feedback circuit coupled between the first auxiliary node and the second auxiliary node, and arranged to provide a feedback resistance between the first auxiliary node and the second auxiliary node; and a weighting circuit coupled between the second auxiliary node and the sum node, and arranged to weight the auxiliary signal by a weighting gain and provide the cancelling signal to the sum node in response to the weighted auxiliary signal; wherein the weighting gain is in association with a ratio between the feedback resistance and the interface resistance.

11. The receiver as claimed in claim 10, wherein when a first voltage fluctuation at the second auxiliary node induced a second voltage fluctuation at the first auxiliary node, the main amplifier core provides a first current fluctuation to the sum node in response to the second voltage fluctuation, the weighting circuit provides a second current fluctuation to the sum node in response to the first voltage fluctuation, wherein the first current fluctuation and the second current fluctuation are out-of-phase.

12. The receiver as claimed in claim 11, wherein the main amplifier core transfers the second voltage fluctuation to the first current fluctuation with a trans-conductance gain, the weighting circuit transfers the first voltage fluctuation to the second current fluctuation with the weighting gain, and a ratio between the trans-conductance gain and the weighting gain is in association with the ratio between the feedback resistance and the interface resistance.

13. The receiver as claimed in claim 10, wherein the main amplifier core is arranged to draw a first signal current from the sum node in response to a first signal voltage at the input node, the auxiliary amplifier core and the feedback circuit are arranged to provide a second signal voltage in response to the first signal voltage, and the weighting circuit is arranged to draw a second signal current from the sum node in response to the second signal voltage; wherein the first signal voltage and the second signal voltage are out-of-phase, the first signal current and the second signal current are in-phase.

14. The receiver as claimed in claim 10, wherein the auxiliary amplifier core comprises:

a first transistor comprising a first gate, a first drain and a first source respectively coupled to the first auxiliary node, the second auxiliary node and a first supply voltage, and a second transistor comprising a second gate, a second drain and a second source respectively coupled to the first auxiliary node, the second auxiliary node and a second supply voltage.

15. The receiver as claimed in claim 10, wherein the main amplifier core comprises:

an input stage coupled between the input node and the sum node, and comprising a first transistor which comprises a first gate, a first drain and a first source respectively coupled to the input node, the sum node and a first supply voltage; and the weighting circuit comprises:

a second transistor comprising a second gate, a second source and a second gate respectively coupled to the second auxiliary node, the sum node and a second supply voltage.

16. The receiver as claimed in claim 15, wherein the main amplifier core further comprises:

an output stage coupled between the sum node and the output node, and arranged to draw a current from the output node in response to currents drawn from the sum node respectively by the input stage and the weighting circuit.

17. The receiver as claimed in claim 16, wherein the output stage comprises:

a third transistor comprising a third gate, a third drain and a third source respectively coupled to a first bias, the output node and the sum node.

* * * * *